(12) United States Patent
Schulze et al.

(10) Patent No.: US 7,439,198 B2
(45) Date of Patent: Oct. 21, 2008

(54) METHOD FOR FABRICATING A BURIED METALLIC LAYER IN A SEMICONDUCTOR BODY AND SEMICONDUCTOR COMPONENT HAVING A BURIED METALLIC LAYER

(75) Inventors: Hans-Joachim Schulze, Ottobrunn (DE); Helmut Strack, Munich (DE)

(73) Assignee: Infineon Technologies AG, Munich (DE)

( * ) Notice: Subject to any disclaimer, the term of this patent is extended or adjusted under 35 U.S.C. 154(b) by 376 days.

(21) Appl. No.: 11/153,239

(22) Filed: Jun. 15, 2005

(65) Prior Publication Data
US 2006/0014400 A1 Jan. 19, 2006

(30) Foreign Application Priority Data
Jun. 15, 2004 (DE) .................. 10 2004 028 933

(51) Int. Cl.
*H01L 21/00* (2006.01)
(52) U.S. Cl. ............... 438/799; 438/795; 257/E21.476; 257/E21.497
(58) Field of Classification Search ........... 438/795, 438/799; 257/E21.476, 497
See application file for complete search history.

(56) References Cited

U.S. PATENT DOCUMENTS

| | | | | |
|---|---|---|---|---|
| 2,739,088 A | * | 3/1956 | Pfann | ............ 117/50 |
| 2,813,048 A | | 11/1957 | Pfann | |
| 3,898,106 A | * | 8/1975 | Cline et al. | ............ 117/40 |
| 3,972,741 A | * | 8/1976 | Anthony et al. | ............ 438/541 |
| 4,159,215 A | | 6/1979 | Chang et al. | |
| 4,184,897 A | | 1/1980 | Anthony et al. | |
| 5,798,297 A | | 8/1998 | Winnerl et al. | |
| 2004/0261839 A1 | * | 12/2004 | Gee et al. | ............ 136/256 |

FOREIGN PATENT DOCUMENTS

DE  29 32 191 A1  4/1980

(Continued)

OTHER PUBLICATIONS

Morillon et al., "Power Device Insulation by Al Thermomigration", ISPS 2002-6th International Seminar on Power Semiconductors, Prague, Sep. 4-6, 2002, pp. 145-149, (5 pages).

(Continued)

*Primary Examiner*—Bradley K Smith
(74) *Attorney, Agent, or Firm*—Maginot, Moore & Beck

(57) ABSTRACT

A method for fabricating a buried metallic layer at a predetermined vertical position in a semiconductor body having a first and second side includes a step of applying a metal layer to one of the first and second sides at least in sections. The method also includes establishing a positive temperature gradient in a vertical direction of the semiconductor body proceeding from the one side. The temperature in the region of the one side is higher than the eutectic temperatures of system, so that the metal of the metal layer migrates in the vertical direction into the semiconductor body. The method also includes discontinuing the temperature gradient once the metal reaches the predetermined vertical position in the semiconductor body, in order thereby to obtain the metallic layer at the predetermined position.

25 Claims, 11 Drawing Sheets

FOREIGN PATENT DOCUMENTS

| | | |
|---|---|---|
| DE | 29 37 940 A1 | 4/1980 |
| DE | 199 53 333 A1 | 5/2001 |
| DE | 100 01 869 A1 | 7/2001 |
| DE | 100 14 659 C2 | 8/2002 |
| JP | 08148504 A | 6/1996 |

OTHER PUBLICATIONS

Widmann, Mader, Friedrich, "Technologie hochintegrierter Schaltungen," Auflage, Springer, 1996 (4 pages).

Widmann, Mader, Friedrich, "Technologie hochintegrierter Schaltungen," Auflage, Springer, 1996 (7 pages of English language translation).

* cited by examiner

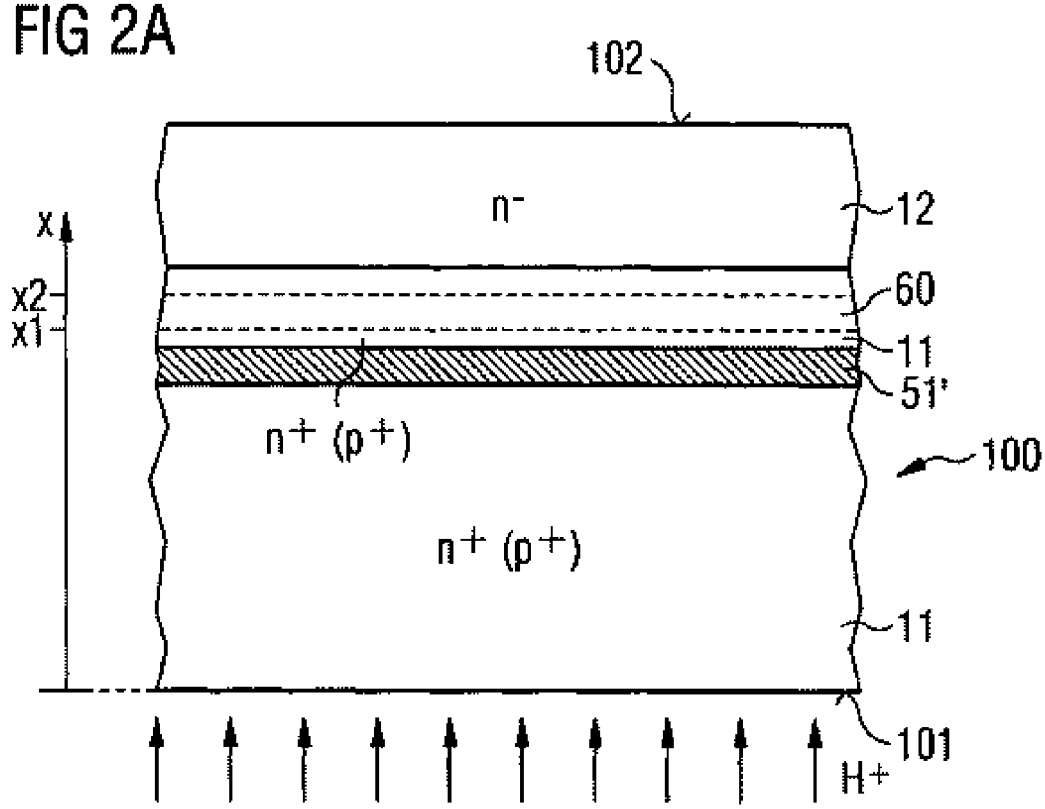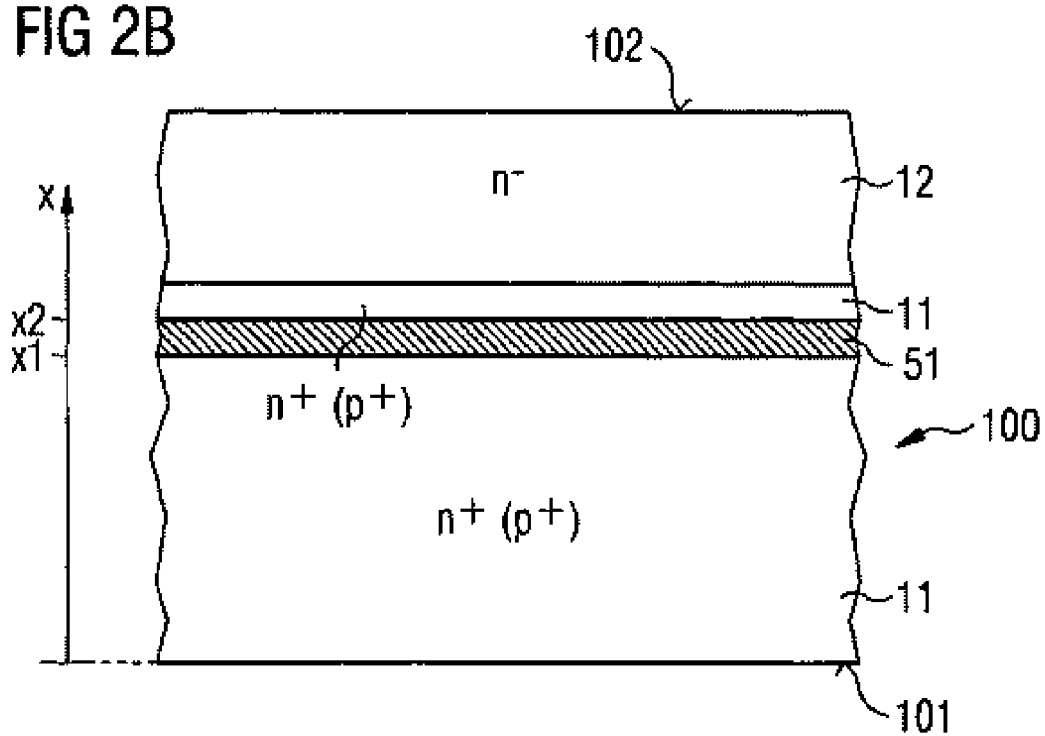

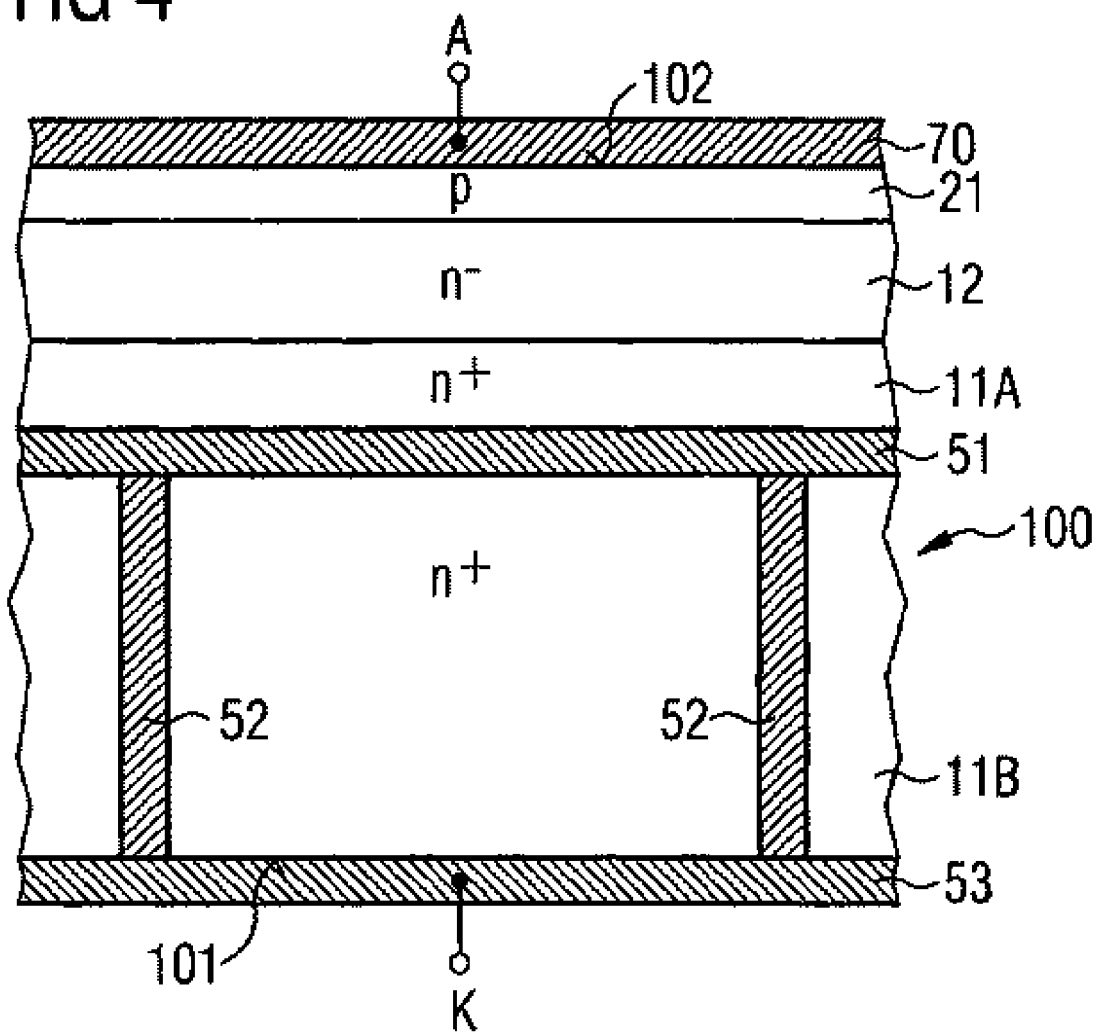

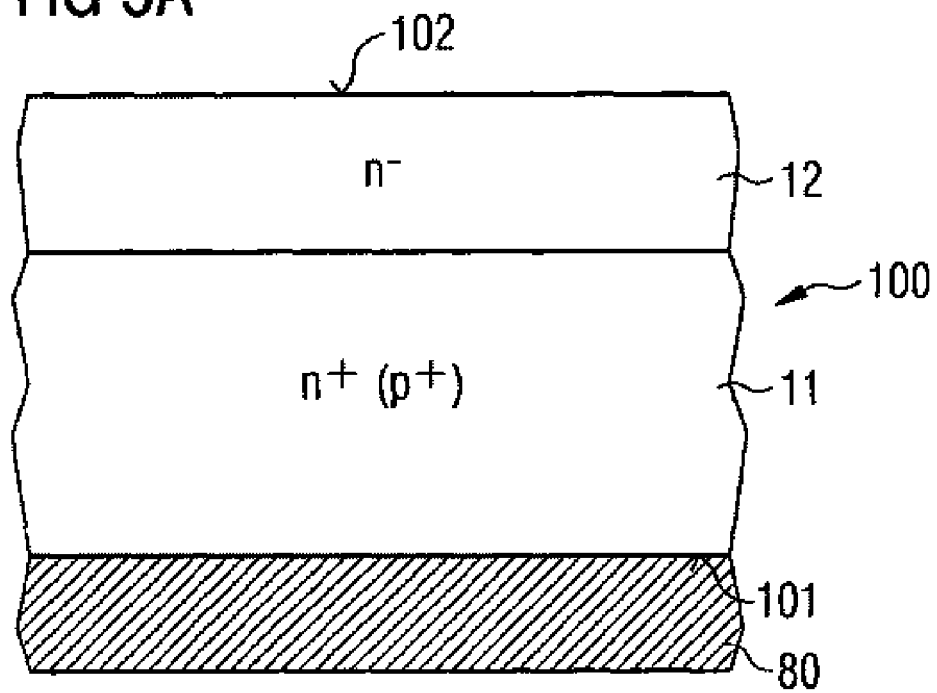
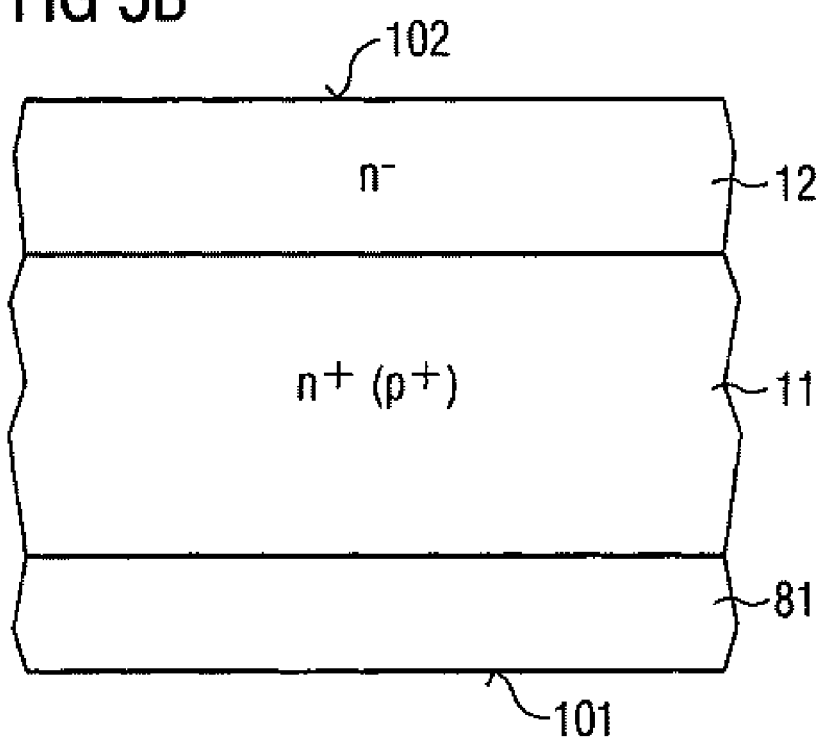

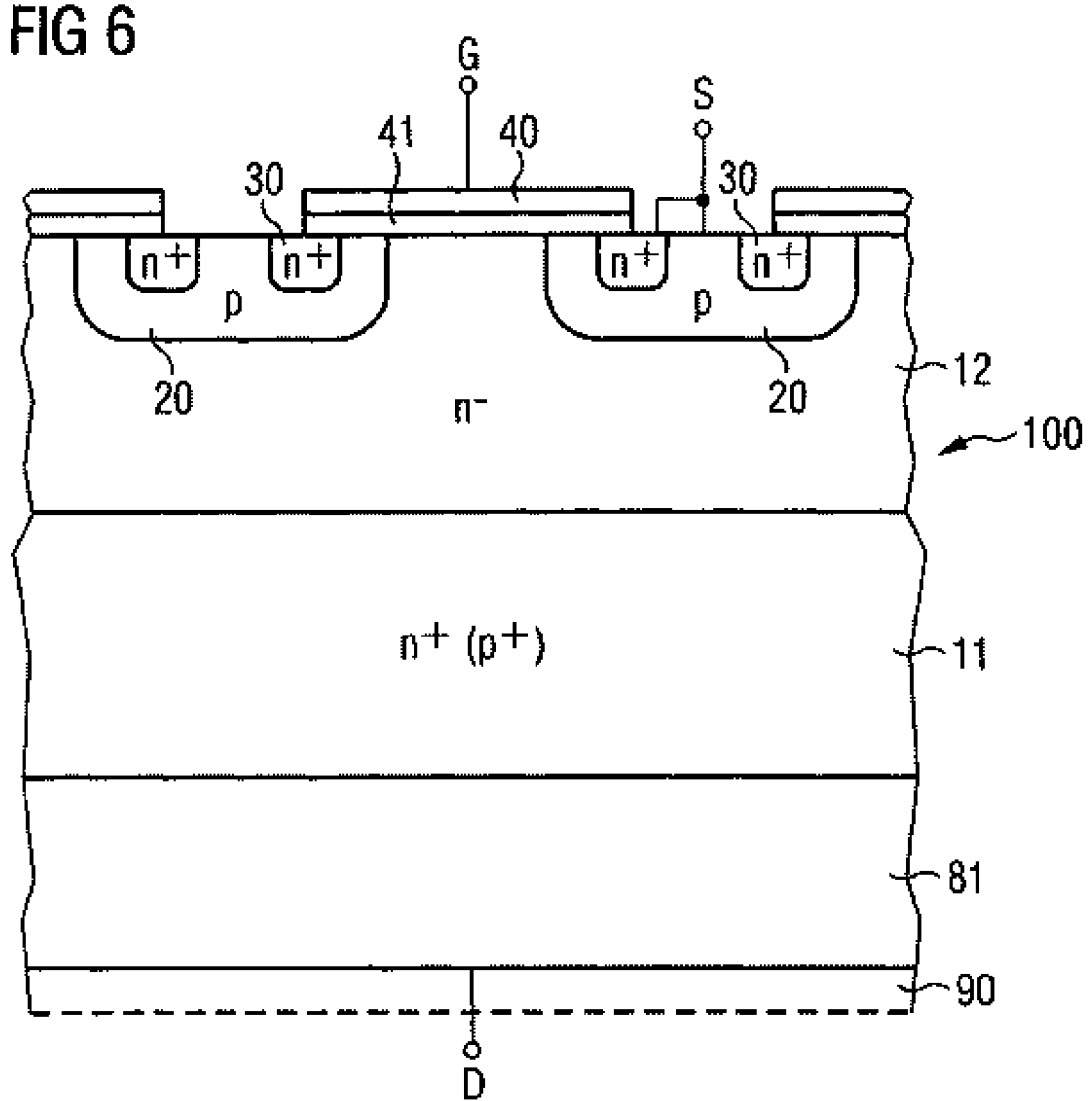

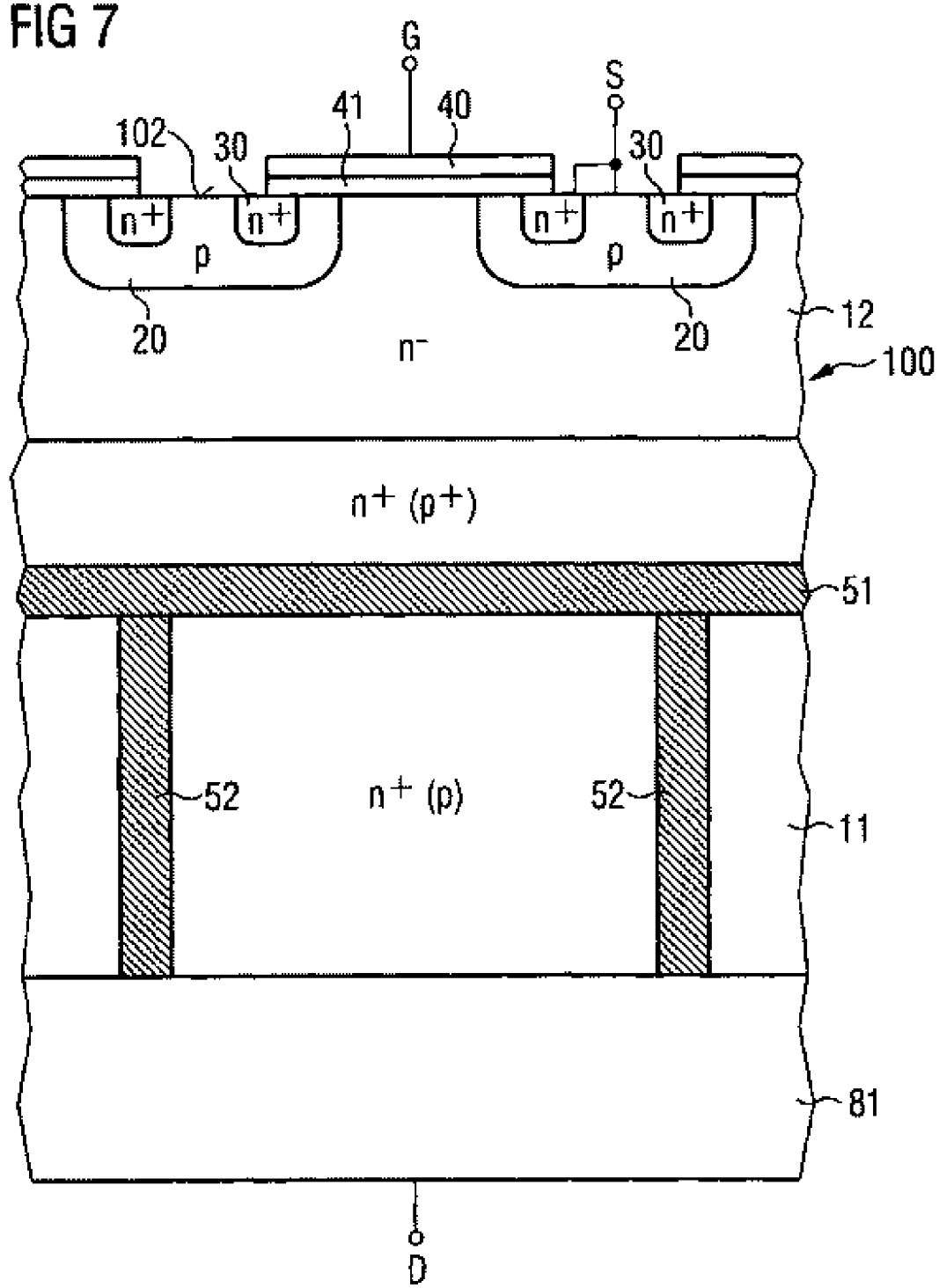

METHOD FOR FABRICATING A BURIED METALLIC LAYER IN A SEMICONDUCTOR BODY AND SEMICONDUCTOR COMPONENT HAVING A BURIED METALLIC LAYER

FIELD OF THE INVENTION

Method for fabricating a buried metallic layer in a semiconductor body and semiconductor component having a buried metallic layer.

BACKGROUND

The present invention relates to a method for fabricating a buried metallic layer in a semiconductor body and a semiconductor component having a buried metallic layer.

It is known that the behavior of semiconductor components can be influenced by the provision of buried metallic layers arranged in semiconductor regions of the components.

In this respect, reference is made to DE 100 01 869 A1, by way of example, which describes a MOSFET which blocks in both directions and in the body zone of which a metallic layer is arranged. Said metallic layer acts as a recombination zone for free charge carriers in the body zone and reduces the current gain of a parasitic bipolar transistor formed by the body zone, the source zone and the drain zone of the MOSFET.

The recombination effect of metals can also be utilized in components which comprise a plurality of components arranged in a semiconductor layer or a substrate and in which the individual components are in each case insulated from one another by pn junctions. In the case of such components, it is possible, depending on the external circuitry, for minority charge carriers to be injected through individual components into the substrate, which lead to shunt currents in the substrate. Said shunt currents can adversely influence the function of other components arranged in the substrate. This problem area is described for example in DE 199 53 333 A1 or DE 100 14 659 C2, which propose producing a recombination zone in the substrate by implanting or introducing metal atoms. An improved recombination effect could be achieved in this case by means of a metallic layer in the substrate.

SUMMARY

It is an aim of the present invention to provide a method for fabricating a buried metallic layer in a semiconductor layer and a semiconductor component having a buried semiconductor layer.

The method according to the invention for fabricating a buried metal layer at a predetermined vertical position in a semiconductor body having a first and a second side comprises applying a metal layer to one of the first and second sides at least in sections, establishing a positive temperature gradient in a vertical direction of the semiconductor body proceeding from the one side, the temperature in the region of the one side being higher than the eutectic temperature of a system comprising the material of the metal layer and the semiconductor material of the semiconductor body and the temperature rising proceeding from said side in the vertical direction of the semiconductor body, so that the metal of the metal layer migrates in the vertical direction into the semiconductor body. The temperature gradient is discontinued once the metal migrating into the semiconductor body reaches the predetermined vertical position in the semiconductor body, in order thereby to obtain the metallic layer at the predetermined position. The eutectic temperature, which is also referred to as the alloying temperature, denotes the temperature at which the material of the metal layer and the semiconductor material used form an alloy. "Eutectic temperature" hereinafter always designates the eutectic temperature of a system comprising the material of the metal layer and the semiconductor material of the semiconductor body, that is to say of such a metal-semiconductor system.

The metal used for fabricating the metallic layer is for example a material that p-dopes the semiconductor body, such as aluminum, for example, which is applied to the one side of the semiconductor body, for example by vapor deposition.

Aluminum atoms migrating through the semiconductor body leave behind a p-type doping in the regions through which they migrate. If the metallic layer is intended to be produced in an n-doped semiconductor zone, said p-type doping that is additionally produced by the migrating aluminum atoms can be compensated for as required by choosing the n-type basic doping of the semiconductor zone to be correspondingly higher prior to the fabrication of the metallic layer.

Equally, the metal layer may comprise a material that n-dopes the semiconductor body. Examples of such materials are mixtures with tin (Sn) and arsenic (As) or with tin (Sn) and antimony (Sb).

Atoms of such mixtures which migrate through the semiconductor body leave behind an n-type doping in the regions through which they migrate. If the metallic layer is intended to be produced in a p-doped semiconductor zone, said n-type doping that is additionally produced by the migrating atoms may be compensated for as required by choosing the p-type basic doping of the semiconductor zone to be correspondingly higher prior to the fabrication of the metallic layer.

The fabrication of the buried layer in a p-doped semiconductor zone is preferably effected using a metal or metal mixture that p-dopes the semiconductor body, and the fabrication of the buried layer in an n-doped semiconductor zone is preferably effected using a metal or metal mixture that n-dopes the semiconductor body. On account of the additional doping added by the migrating metal, the basic doping of the semiconductor zone in which the buried layer is produced may, if appropriate, be chosen to be lower.

The use of a thermomigration method, that is to say a method in which metal atoms migrate through a semiconductor body under the influence of a temperature gradient, is known in principle for producing p-type insulation regions in a semiconductor body. Such a thermomigration method is described for example in Morillion, B. et al.: "Power Device Insulation by Al Thermomigration", ISPS'02-6th International Seminar on Power Semiconductors, Prague, Sep. 4 to 6, 2002, pages 145 to 149.

The metallic layer produced in the semiconductor body by means of the method according to the invention can be produced at arbitrary positions in the semiconductor body and thus in the region of arbitrary zones of components integrated in the semiconductor body. The metallic layer can thus be used for different purposes depending on the position in the semiconductor body.

There is thus the possibility of producing the metallic layer as a recombination zone in a body zone of a MOSFET. For this purpose, the metallic layer is applied to one of the sides in sections in a region that lies above a body zone of the MOSFET integrated in the semiconductor body. The metal of the applied metal layer is subsequently introduced into the semiconductor body as far as the desired position under the action of a positive temperature gradient established proceeding from the one side.

The buried metallic layer may also be used for the fabrication of a low-impedance terminal electrode of a vertical semiconductor component. In the case of such vertical power components, load terminals of the component are situated on opposite sides of a semiconductor body or semiconductor chip in which the component is integrated. A highly doped semiconductor substrate usually forms the basis for the fabrication of such semiconductor components, a more weakly doped semiconductor layer being applied to said semiconductor substrate, for example by means of an epitaxy method. In this case, active component zones, for example a cell array of a power transistor, are realized in said more weakly doped layer. What are critical for the electrical properties of such power components are, in particular, the doping and the dimensioning in the vertical direction of the more weakly doped semiconductor layer applied to the semiconductor substrate. In this case, the semiconductor substrate essentially serves for making low-impedance contact with said more weakly doped semiconductor layer proceeding from one of the sides of the semiconductor body, in which case, for stability reasons, the thickness of the semiconductor substrate must not fall below a specific thickness in order to ensure that the component can be handled during the fabrication process.

In order to reduce the resistance proportion of the total resistance of the component that is caused by the semiconductor substrate, one embodiment of the method according to the invention provides for a metallic layer to be produced in the semiconductor substrate, and for said metallic layer to be connected via electrically conductive, preferably metallic, terminal connections to an electrically conductive layer applied to the surface of the substrate.

The speed at which the metal migrates in the semiconductor body in the vertical direction during the method for fabricating the metallic layer is dependent on the temperature and the positive temperature gradient established. The distance which the metal covers in the vertical direction of the semiconductor body is correspondingly dependent on the duration for which the temperature gradient is present. In order to establish said temperature gradient, there is the possibility, for example, of heating the two sides of the semiconductor body to different temperatures by means of an RTA method (RTA=rapid thermal annealing), the temperature in the region of the side to which the metal layer is applied lying above the eutectic temperature of the metal-semiconductor system and the temperature on the other side being higher than this temperature. The temperature difference lies between 2 K and 10 K, by way of example.

Furthermore, there is the possibility of achieving a thermomigration by producing a temperature that lies above the eutectic temperature in the region of the metal layer side and a higher temperature with a temperature maximum within the semiconductor body, as a result of which the metal migrates to the location of said temperature maximum in the semiconductor body.

Temperature conditions of this type can be achieved for example by irradiating the semiconductor body with particles, in particular with protons. It is known that irradiating a semiconductor body with particles leads to heating of the semiconductor body, the temperature maximum in this case lying in the so-called end-of-range region of the particle irradiation. The position of said end-of-range region, and hence the position of the temperature maximum, can be established by way of the irradiation energy of the particles.

In this case, the particle irradiation may serve both for establishing the temperature in the region of the metal layer, which has to be higher than the eutectic temperature, and for establishing the temperature within the semiconductor body. In this case, the irradiation is preferably effected via the side on which the metal layer is applied.

As an alternative, there is the possibility of additionally raising the temperature of the semiconductor wafer, for example by additionally heating the sample mount during the irradiation, and of using the particle irradiation essentially for establishing the temperature maximum within the semiconductor body.

The fabrication of the metallic layer in the semiconductor body is preferably effected using two successive migration steps, in which case, in a first migration step, the temperature gradient is effected by establishing different temperatures in the region of the two sides of the semiconductor body, in order to perform a coarse positioning of the metallic layer in the semiconductor body. Afterward, in a second migration step, a temperature maximum is produced within the semiconductor body by particle irradiation in order to define the end position of the metallic layer by way of the position of said temperature maximum.

If the buried metallic layer is used for lowering the contact resistance of a semiconductor substrate, there is the possibility of producing a metal-semiconductor alloy layer in addition to said buried metallic layer. In order to fabricate such a semiconductor-metal alloy layer, after the fabrication of the metallic buried layer, a further metal layer is applied to one of the sides of the semiconductor body, via which contact is intended to be made with the buried metal layer. Afterward, the semiconductor body is heated to a temperature at which the metal melts and combines with the semiconductor material of the semiconductor body to form a metal-semiconductor alloy. With the use of aluminum as metal and silicon as semiconductor material, said temperature is approximately in the region of 700° C. At such temperatures, penetration depths of the aluminum eutectic of approximately 40 μm are possible in order thus to produce a metal-semiconductor alloy layer having this thickness.

The metal-semiconductor alloy layer is preferably produced in such a way that it reaches as far as the buried metallic layer in order to directly make contact with this metal layer, or at least reaches close to this buried metal layer in order to minimize the resistance between the alloy layer and the buried layer. As an alternative, there is the possibility of fabricating terminal connections running in the vertical direction between the metal-semiconductor alloy layer and the buried metallic layer.

In the case of thin semiconductor substrates, even the fabrication of a metal-semiconductor alloy layer may contribute to a considerable reduction of the substrate resistance, so that it may be possible to dispense with the fabrication of the buried metallic layer. A method for fabricating a low-impedance terminal electrode for a semiconductor component comprising providing a semiconductor body having a first and second side, applying a metal layer to one of the sides, and also heating the semiconductor body to a temperature at which the metal of the metal layer forms a metal-semiconductor alloy layer with the semiconductor material of the semiconductor body in the region of the one side, is the subject matter of patent claim 33.

BRIEF DESCRIPTION OF THE DRAWINGS

The present invention is explained in more detail below using exemplary embodiments with reference to figures.

FIG. 2 illustrates method steps for fabricating a buried metallic layer with a temperature gradient being established in a semiconductor body by means of particle irradiation.

FIG. 4 shows a vertical semiconductor component designed as a diode with a low-impedance terminal electrode comprising a buried semiconductor layer.

FIG. 5 illustrates a second method for fabricating a low-impedance terminal electrode for a semiconductor component.

FIG. 6 shows a vertical semiconductor component designed as a MOSFET with a low-impedance terminal electrode fabricated in accordance with the second method.

FIG. 7 shows a vertical semiconductor component designed as a MOSFET with a terminal electrode comprising a buried semiconductor layer and a metal-semiconductor alloy layer.

In the figures, unless specified otherwise, identical reference symbols designate identical parts with the same meaning.

DETAILED DESCRIPTION

Figure 1A:
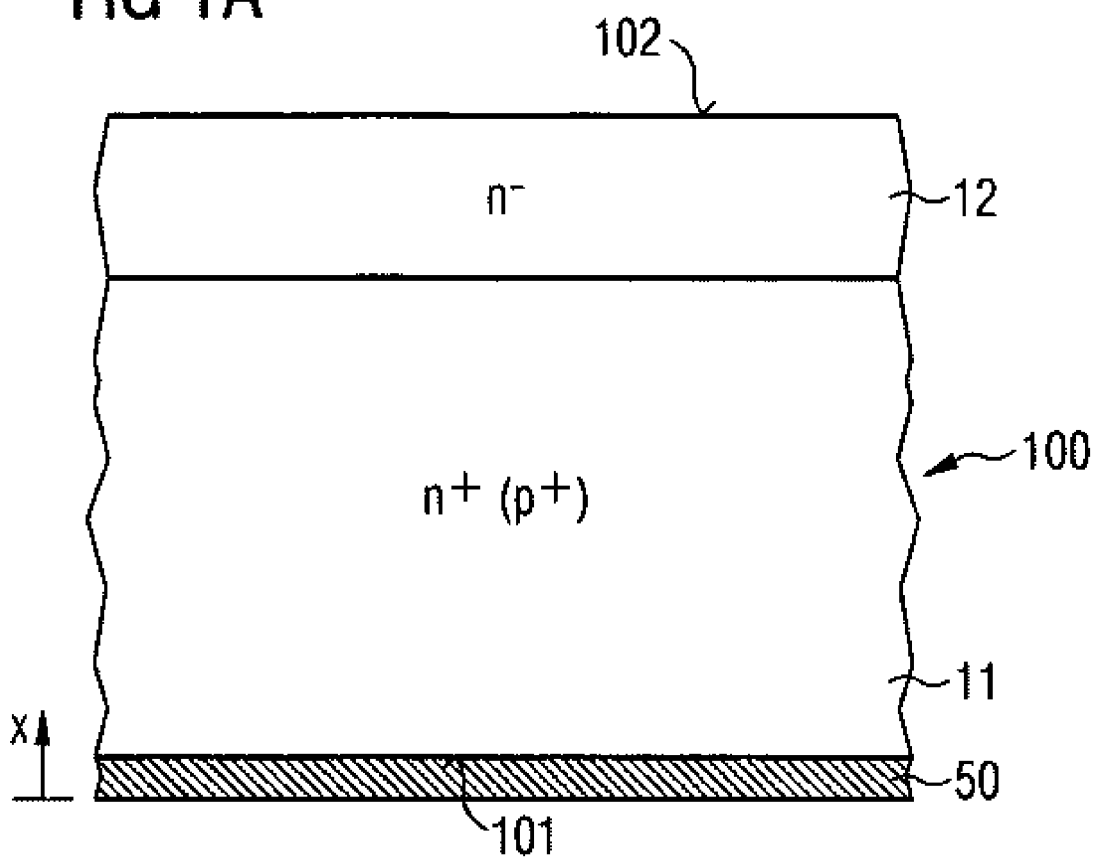
FIG. 1 shows a method for fabricating a low-impedance terminal electrode—comprising a buried semiconductor layer—of a semiconductor component during different method steps of the fabrication method.

A method for fabricating a low-impedance terminal electrode of a semiconductor component, which comprises a buried metallic layer, is explained below with reference to FIG. 1.

The starting point of the method is formed by the provision of a semiconductor body 100, which, in the exemplary embodiment, comprises a first and second semiconductor layer 11, 12, of which the first semiconductor layer 11 forms a first side 101 of the semiconductor body 100, which is designated hereinafter as the rear side, and the second semiconductor layer 12 forms a second side 102 of the semiconductor body 100, which is designated hereinafter as the front side. The first semiconductor layer 11 is a highly doped semiconductor substrate, for example, which is n-doped or p-doped depending on the application purpose. The second semiconductor layer 12 is applied to the semiconductor substrate 11 by means of an epitaxy method, for example, and is doped more weakly than the semiconductor substrate 11. Depending on the desired function of the component to be realized, the second semiconductor layer 12 is of the same conduction type as the first semiconductor layer 11 or doped complementarily with respect thereto.

For the fabrication of a buried metallic layer in the semiconductor body 100, the method provides for applying a metal layer 50 to one of the sides, to the rear side 101 in the example, of the semiconductor body 100 and for establishing a positive temperature gradient proceeding from said side 101. The metal layer is an aluminum layer, for example, or comprises a mixture of tin and arsenic or tin and antimony, for example. Establishing a positive temperature gradient means establishing a temperature profile with a temperature that rises proceeding from the rear side 101 in the vertical direction in the semiconductor body 100. Said vertical direction is designated as the x direction in figure 1*a*. The temperature in the region of the rear side 101 is chosen such that it lies above the eutectic temperature of the metal. This temperature is approximately 577° C. for aluminum.

Figure 1B:
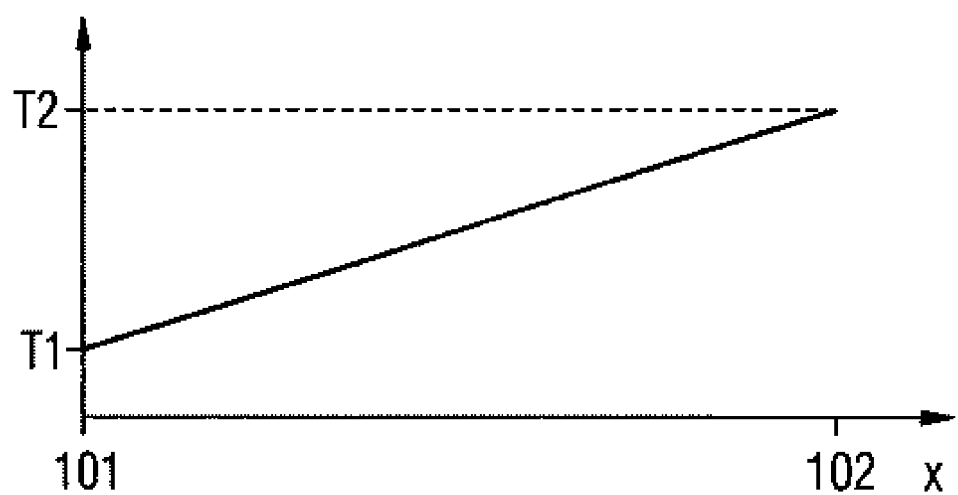

FIG. 1*b* schematically illustrates the temperature profile in the semiconductor body proceeding from the rear side 101 in the x direction as far as the front side 102. The temperature in the region of the rear side 101 is T1 and lies above the eutectic temperature of the metal used for the metal layer 50. The temperature in the region of the front side 102 is T2 and is higher than the temperature T1 in the region of the rear side. The temperature difference between the temperature T1 in the region of the rear side 101 and the temperature T2 in the region of the front side 102 for establishing the positive temperature gradient is between 2 K and 10 K, by way of example.

The establishment of the temperatures T1, T2 in the region of the rear and front sides 101, 102 is effected by means of an RTA method, by way of example.

On account of the temperature T1 lying above the eutectic temperature of the metal-semiconductor system in the region of the rear side 101 and on account of the positive temperature gradient, the metal of the metal layer 50 migrates into the semiconductor body 100 in the vertical direction. The migration process stops if the temperature in the region in which the metal is situated during the migration process is lowered to a temperature below the eutectic temperature, which is certainly the case when the temperature at both sides of the semiconductor body 100 is lowered below said eutectic temperature, or when the heating of the semiconductor body is set. The initially liquid metal that has migrated into the semiconductor body 100 then condenses to form a buried metallic layer 51 in the semiconductor body 100, which is illustrated as the result in FIG. 1*c*.

The speed at which the metal migrates into the semiconductor body 100 is dependent on the temperature gradient, that is to say dependent on the temperature difference between the temperatures T2, T1 established in the region of the front side and rear side. The position of the metallic layer 51 in the semiconductor body, that is to say the distance between the rear side 102 and the metallic layer 51, can thus be established by way of the temperature gradient and the duration for which the temperature gradient is present. Equally, the migration can be influenced by way of the magnitude of the average value (T1+T2)/2 of the temperatures T1, T2 established. In this case, it holds true that the migration speed increases as the average temperature rises.

The metallic layer 51 contains a mixture of semiconductor material and predominantly metal, that is to say for example of silicon and aluminum, or silicon and tin with proportions of arsenic or silicon and tin with proportions of antimony, which has metallic properties and which therefore has both a very good conductivity and a very strong recombination effect.

The semiconductor region between the rear side 101 and said metallic layer 51 acquires—in the illustrated example of a layer 50 composed of aluminum—a p-type doping as a result of the migration of the aluminum atoms, said doping corresponding to the solid solubility of aluminum of approximately $10^{19}$ atoms per $cm^3$. If the semiconductor substrate has an n-type doping with a doping concentration of greater than $3 \cdot 10^{19}$ atoms per $cm^3$, then this n-type doping is also preserved after the migration of the aluminum atoms, the concentration of free charge carriers being reduced. If the semiconductor substrate has a p-type doping, then this p-type doping is strengthened by the migration of the aluminum atoms.

If, in a manner that is not specifically illustrated, a metal layer that n-dopes the semiconductor body is used, then the semiconductor body acquires an additional n-doping in the region through which the metal atoms migrate, which doping either strengthens an n-type doping already present or partially compensates for, i.e. weakens, a p-type doping already present.

The method for fabricating a low-impedance terminal electrode furthermore comprises fabricating electrically conductive, preferably metallic, terminal connections 52 that reach in the vertical direction from the rear side 101 as far as the buried metallic layer 51. Said terminal connections 52 may be fabricated for example by etching or sawing trenches into the semiconductor body 100 proceeding from the rear side 101 and by subsequently filling said trenches with an electrically conductive material, preferably a metal.

The fabrication of these metallic terminal connections 52 is followed by the application of a contact layer 53, preferably a metal layer, to the rear side 101. In this case, it is also possible to effect the fabrication of the terminal connections 52 after the production of the trenches and the fabrication of the contact layer 53 in one method step. For this purpose, after the fabrication of the trenches, an electrically conductive material is deposited which covers at least the semiconductor surfaces in the trenches and which covers the semiconductor surface between the trenches in the region of the rear side 101.

The result of this fabrication method is a low-impedance terminal electrode comprising the buried metallic layer 51, the terminal connections 52 running in the vertical direction and also the contact layer 53. The resistance of this terminal electrode is determined by the nonreactive resistance of the buried layer, of the terminal connections 52 and of the contact layer 53. Provided that this resistance is significantly lower than the resistance of the semiconductor substrate 11, the semiconductor material of the semiconductor substrate 11 arranged between the buried semiconductor layer 51 and the contact layer 53 makes only an insignificant contribution to the resistance of said terminal electrode. All that is effective for the resistance of said terminal electrode, which serves for making contact with the more weakly doped semiconductor layer 12 via the rear side 101 of the semiconductor body, is that section of the semiconductor substrate 11 which is arranged between said more weakly doped semiconductor layer 12 and the buried semiconductor layer 51. Through suitable setting of the thermomigration method in the context of the fabrication of the buried semiconductor layer 51, however, it is possible to minimize the dimensioning of this residual substrate layer 11 between the buried layer 51 and the second semiconductor layer 12.

Figure 10:
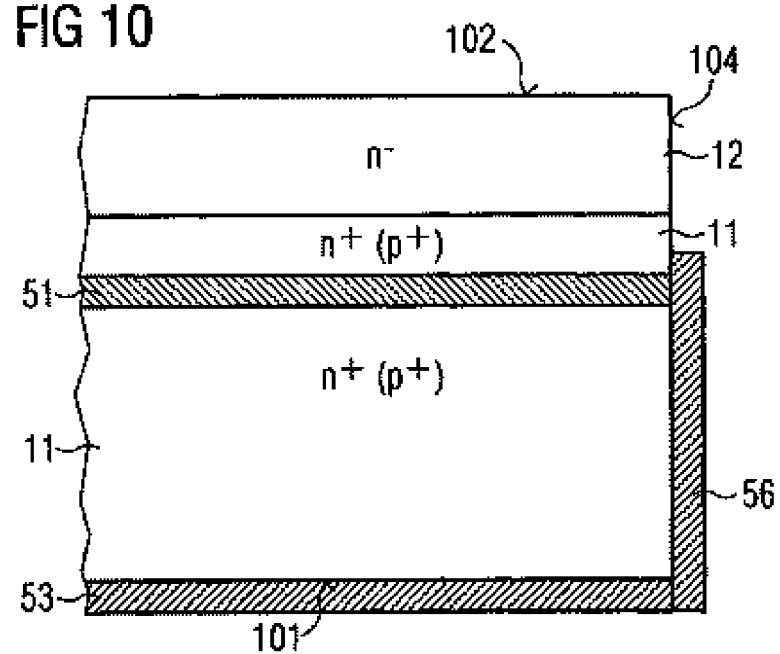
FIG. 10 shows, in side view in cross section, a detail from a semiconductor body with a buried metallic layer and with a terminal connection which is applied to an edge of the semiconductor body and makes contact with the metallic layer.

Instead of or else in addition to the terminal connections 52 in trenches as illustrated in FIG. 1, it is also possible, referring to FIG. 10, to provide terminal connections 56 at side edges 104 of the semiconductor body 100 in order to connect the buried metal layer 51 to a rear-side contact layer 53. FIG. 10 shows a detail from the semiconductor body in the region of such an edge 104 delimiting the semiconductor body 100 in the lateral direction. In this case, the buried metal layer 51 and the contact layer 53 are formed in such a way that they reach in the lateral direction of the semiconductor body as far as said edge 104. The connection layer 56 is applied to the edge 104, said connection layer being a metal layer, for example, and reaching in the vertical direction at least from the contact layer 53 at the rear side 101 as far as the level of the buried metal layer 51.

The connection layer 56 may be arranged circumferentially over the entire edge 104 in a direction that is not specifically illustrated, the buried metal layer 51 and the contact layer 53 in this case extending as far as the edge 104 in all lateral directions.

A method for the exact alignment of the position of the buried metal layer 51 in the semiconductor body is explained below with reference to FIG. 2.

The method proceeds from a metallic layer 51' already having undergone coarse positioning in the semiconductor body 100. Said coarse positioning is effected for example on the basis of the method explained in figures 1a to 1c, in which a temperature gradient is established by establishing different temperatures at the opposite front and rear sides 102, 101 of the semiconductor body. For the "fine positioning" of the metallic layer 51 illustrated in FIG. 2b, provision is made, referring to FIG. 2a, for irradiating the semiconductor body 100 with high-energy particles, for example protons, proceeding from one of the sides, proceeding from the rear side 101 in the present case. Said particles bring about a local heating of the semiconductor body 100, the temperature maximum of said local heating lying in a region 60 representing the so-called end-of-range region of the particle irradiation. In order to achieve a migration of the metallic layer 51' from the initially set position to the position of said temperature maximum 60, it is necessary to establish a temperature gradient which has a positive profile proceeding from the coarse position of the metallic layer 51' in the direction of the temperature maximum, in which case the temperature level overall must lie above the eutectic temperature of the metal used. The particle irradiation brings about a heating of the semiconductor body 100 in the region radiated through. In this case, the irradiation is effected in such a way that the temperature in the region 51' lies above the eutectic temperature and that the temperature maximum in the region 60 lies above said temperature of the region 51'.

Figure 3:
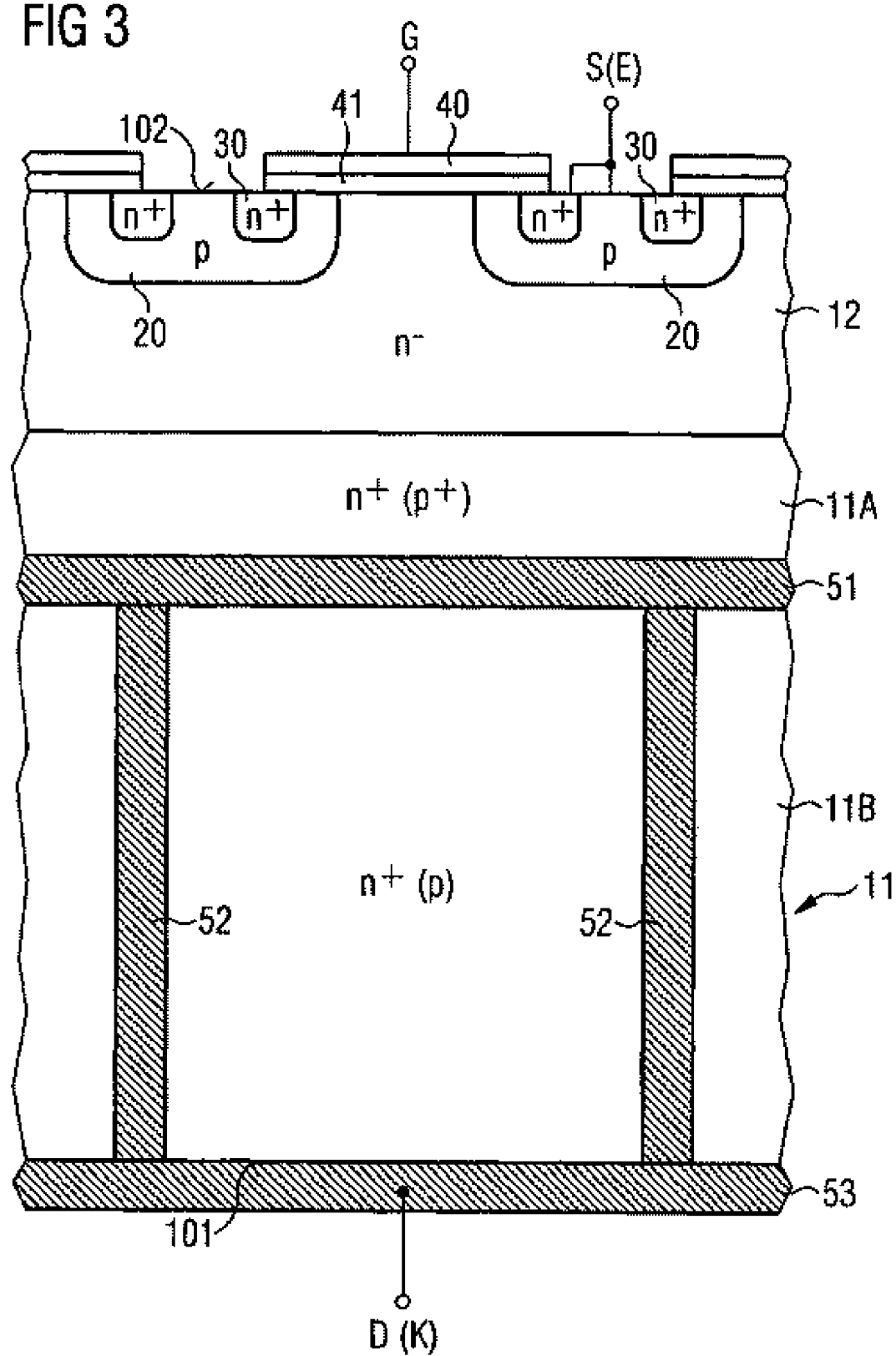
FIG. 3 shows a vertical semiconductor component designed as a MOSFET with a low-impedance terminal electrode comprising a buried semiconductor layer.

FIG. 3 shows, in side view in cross section, a vertical power component designed as a MOSFET with a low-impedance terminal electrode fabricated in accordance with the method explained above. The component comprises a cell array arranged in the second semiconductor layer 12 with body zones 20 doped complementarily with respect to the semiconductor layer 12, source zones 30 doped complementarily with respect to the body zones 20 in turn being formed in said body zones. Contact is made with the source zones 30 by a common source terminal electrode S, which is only illustrated schematically, and said source zones are preferably in each case short-circuited with the body zones 20. A gate electrode 40 serves for driving the component, which gate electrode is insulated from the body zones 20 and source zones 30 by an insulation layer 41 and is arranged in such a way that when a suitable drive potential 40 is present, a conductive channel can form in the body zones 20 in each case between the source zones 30 and the zones of the semiconductor layer 12 that have a basic doping. The regions having the basic doping of the semiconductor layer 12 form the drift zone of the MOSFET. The drain zone of the MOSFET is formed by the section 11A of the first semiconductor layer or of the semiconductor substrate 11 which lies between the second semiconductor layer 12 and the buried metallic layer 51. The buried metallic layer 51, the terminal connections 52 and also the contact layer 53 applied to the rear side 101 form the drain electrode D of the MOSFET.

The electrical properties of this MOSFET, in particular the on resistance thereof and the dielectric strength thereof, are essentially determined by the doping concentration of the drift zone 12 and also the dimensions of the drift zone 12 in the vertical direction between the body zones 20 and the drain zone 11A. The region 11B of the first semiconductor layer or of the semiconductor substrate which lies between the buried metallic layer 51 and the rear side 101 makes only an insignificant contribution to the on resistance of this component since said section is largely short-circuited by the terminal connections 52. The minimum distance between the buried metallic layer 51 and the drift zone should be chosen such that when the maximum reverse voltage is applied to the component, a space charge zone propagating in the drift zone 12 definitely does not reach as far as the metallic layer. This distance is thus dependent on the maximum reverse voltage present during operation of the component, the thickness and the doping concentration of the drift zone 12.

The explanations given apply correspondingly to a component realized as an IGBT, which essentially differs from a MOSFET by the fact that the first semiconductor layer 11 is doped complementarily with respect to the second semiconductor layer 12. In the case of an IGBT, the second semiconductor layer 12 forms the n-type base thereof or the n-type drift zone thereof, the first semiconductor layer 11 forms the p-type emitter or collector, the p-doped zones 20 introduced into the second semiconductor layer 12 form the p-type base or p-type body zones thereof, and the semiconductor zones 30 that are introduced into the p-type base 20 and are doped complementarily with respect thereto form the n-type emitter or source zones thereof.

FIG. 4 shows a semiconductor component designed as a vertical power diode with a low-impedance terminal electrode fabricated according to the invention. The low-impedance terminal electrode with the buried metallic layer 51, the terminal connections 52 and the contact layer 53 in this case serves as a low-impedance cathode contact for the connection of the cathode zone or n-type emitter zone 11A, which is arranged between the buried metallic layer 51 and the second semiconductor layer 12 and is formed by a section of the first semiconductor layer 11. In the region of the front side 102 of the semiconductor body 100, a p-doped semiconductor layer 21 is introduced into the second semiconductor layer 12, which is weakly n-doped in the example, and forms the anode zone or the p-type emitter of the component 21. The section of the second semiconductor layer 12 which is arranged between said p-type emitter 21 and the n-type emitter 11a and has the basic doping of said semiconductor layer forms the n-type base of the diode.

A further method for fabricating a low-impedance terminal electrode of a vertical semiconductor component is explained below with reference to FIG. 5. The starting point of the method is a semiconductor body having a rear side 101 and a front side 102, which semiconductor body has first and second semiconductor zones 11, 12 in the example. The method provides for applying a metal layer 80 to one of the sides, the rear side 102 in the example, of the semiconductor body 100 and subsequently establishing in the region of the metal layer side 101 a temperature that is so high that the metal layer 80 melts and forms a metal-semiconductor alloy layer 81 with the adjoining semiconductor material of the semiconductor body, which alloy layer cures after the cooling of the semiconductor body. The result of this method is a semiconductor body 100 with a low-impedance metal-semiconductor alloy layer 81 present in the region of one of the sides. The thickness of the metal layer 80 may be between 20 μm and 50 μm, for example. The metal layer is for example an aluminum layer or comprises for example a mixture of tin and arsenic or tin and antimony.

FIG. 6 shows, in side view in cross section, a semiconductor component designed as a power MOSFET with such a low-impedance terminal electrode having a metal-semiconductor alloy layer 81. The alloy layer 81 has very low impedance, so that essentially the residual section of the first semiconductor layer 11 between the second semiconductor layer 12 and the metal-semiconductor alloy layer 81 contributes to the on resistance of this component. A low-impedance metal layer 90, illustrated in a dashed fashion in FIG. 6, is preferably applied to said alloy layer 81.

The remaining component structures of the MOSFET illustrated in FIG. 6 correspond to the component structures of the MOSFET already explained with reference to FIG. 4, so that a renewed description of these component structures is dispensed with in order to avoid repetition. It goes without saying that this metal-semiconductor alloy layer 81 may be used for making contact with arbitrary vertical semiconductor components, in particular for making contact with a vertical diode or an IGBT already explained above.

FIG. 7 shows, in side view in cross section, a vertical power component designed as a MOSFET with a transistor cell array arranged in the second semiconductor layer 12. This transistor cell array corresponds to the cell array of the components already explained above with reference to FIGS. 3 and 6, so that a renewed description is dispensed with in order to avoid repetition.

The component in accordance with FIG. 7 comprises a low impedance terminal electrode in the region of the first semiconductor layer or in the region of the semiconductor substrate 11, said terminal electrode being formed by a buried metallic layer 51, a metal semiconductor alloy layer 81 and also terminal connections 52 between the buried metallic layer 51 and the metal-semiconductor alloy layer 81.

In this case, in a manner that is not specifically illustrated, there is also the possibility of fabricating the metal-semiconductor alloy layer 81 in such a way that the latter reaches in the vertical direction as far as the buried metallic layer 51 or at least reaches very close to said metallic layer 51. The terminal connections 52 can then also be dispensed with.

It should be pointed out that the fabrication of the buried zone 51 in the case of the components explained with reference to FIGS. 3, 6 and 7 may be effected both before and after the fabrication of the active component regions 20, 30 arranged in the second semiconductor layer 12. Depending on the material of which the gate electrode 40 is composed, it is possible to fabricate the buried zone 51 before or after the fabrication of said gate electrode 40. Particularly when the gate electrode 40 is composed of a high-temperature-resistant material, such as polysilicon for example, it is also possible to fabricate the gate electrode 40 as early as before the fabrication of the buried zone 51.

If appropriate, the buried zone 51 may even be produced before the fabrication of the second semiconductor layer 12 in the first semiconductor layer 11.

A method for fabricating a MOSFET with a recombination zone 55 is explained below with reference to FIG. 8.

The starting point of the method is the provision of a semiconductor body 100 with a first semiconductor layer 11 in the region of a rear side 101 of the semiconductor body 100 and a second semiconductor layer 12 in the region of a front side 102 of the semiconductor body 100. In this case, the first semiconductor layer 11 is of the same conduction type as the second semiconductor layer 12, but doped more heavily than the second semiconductor layer 12. The first semiconductor layer 11 forms the later drain zone of the component, while the second semiconductor layer 12 forms the later drift zone of the component. Body zones 20 doped complementarily with respect to the second semiconductor layer 12 are introduced into said semiconductor layer 12. Said body zones 20 are fabricated for example by means of a masked implantation or diffusion method.

Metallic layers 54 are arranged on the front side 102 in sections above the body zones 20. Said metallic layers 54 are produced in sections, in a manner that is not specifically illustrated, for example by means of a masked deposition of metal onto the front side 102.

Afterward, proceeding from the front side 102, a positive temperature gradient is established, the temperature in the region of the front side 102 lying above the eutectic temperature of the metal, so that the metal migrates in the vertical direction proceeding from the front side 102 into the body zones 20. In this case, the duration of this migration process is set such that, referring to FIG. 2b, metallic recombination zones 55 are formed at a distance from the front side 102 in the body zones 20. In this case, the dimensions of the metallic layers 54 applied to the front side 102 are chosen such that the recombination zones 55 are preferably completely surrounded by the body zones 20.

This fabrication of the recombination zones 55 is followed by further customary method steps for fabricating source zones 31 in the body zones 20, and also for fabricating a gate electrode 40 insulated from the semiconductor body 100. The result of these further method steps is illustrated in FIG. 8c.

The recombination zones arranged in the body zones 20 serve for reducing the current gain of a parasitic npn bipolar transistor formed by the source zones 31, the body zones 20 and the drift zone 12 or the drain zone 11. In conventional MOSFETs, said parasitic bipolar transistor would considerably reduce the dielectric strength of the components, so that source and body zones are usually short-circuited in order to avoid said parasitic bipolar transistor. Such a short circuit can be dispensed with as required in the case of the component in accordance with FIG. 8c, in which the current gain of said parasitic bipolar transistor is considerably reduced on account of the recombination zone 55, as a result of which a component which blocks both in the drain-source direction and in the source-drain direction is obtained.

Figure 8A:
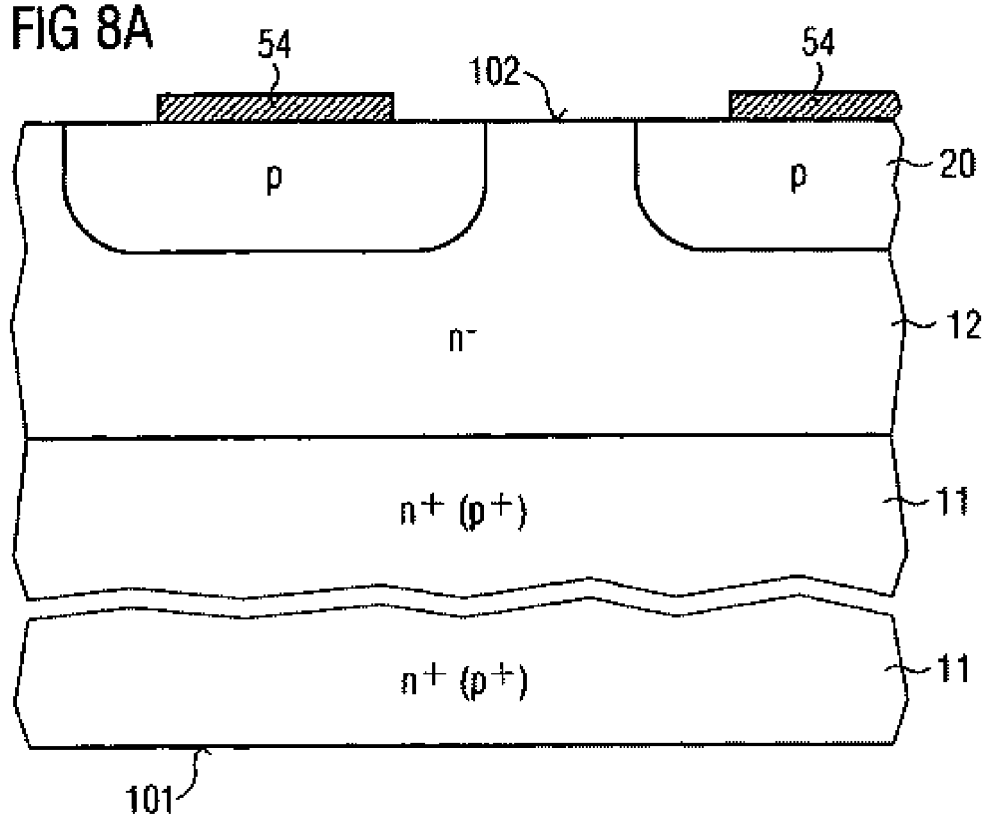
FIG. 8 illustrates method steps for fabricating a buried semiconductor layer serving as a recombination zone of a MOSFET.
Figure 8B:
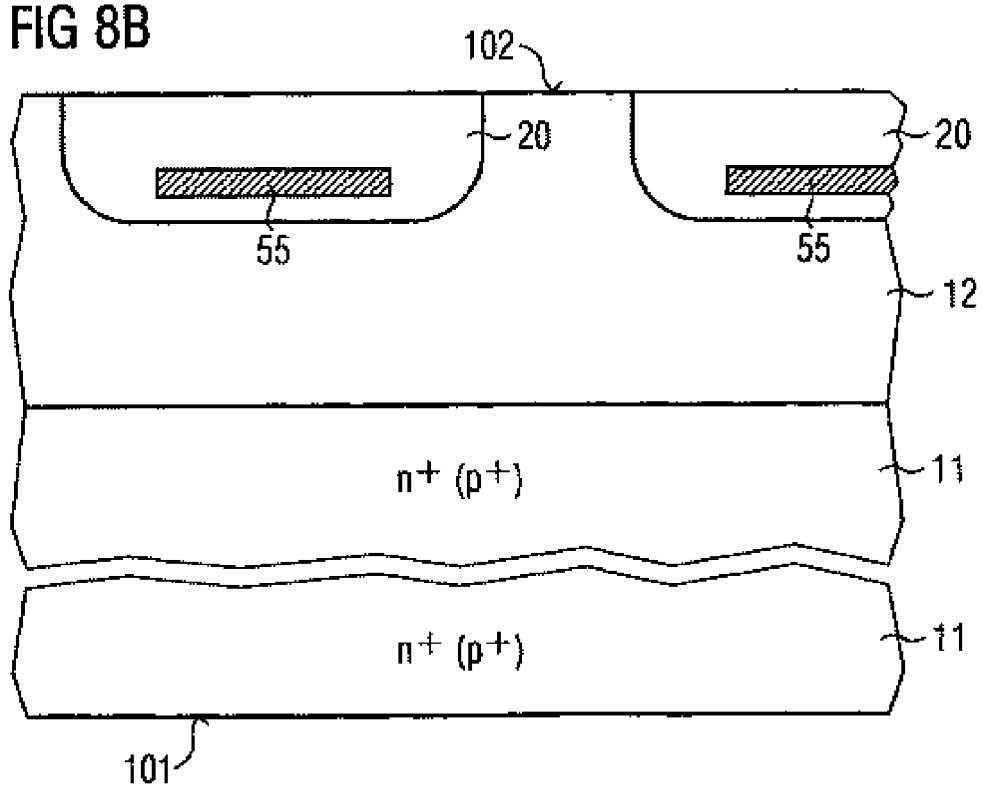
Figure 8C:
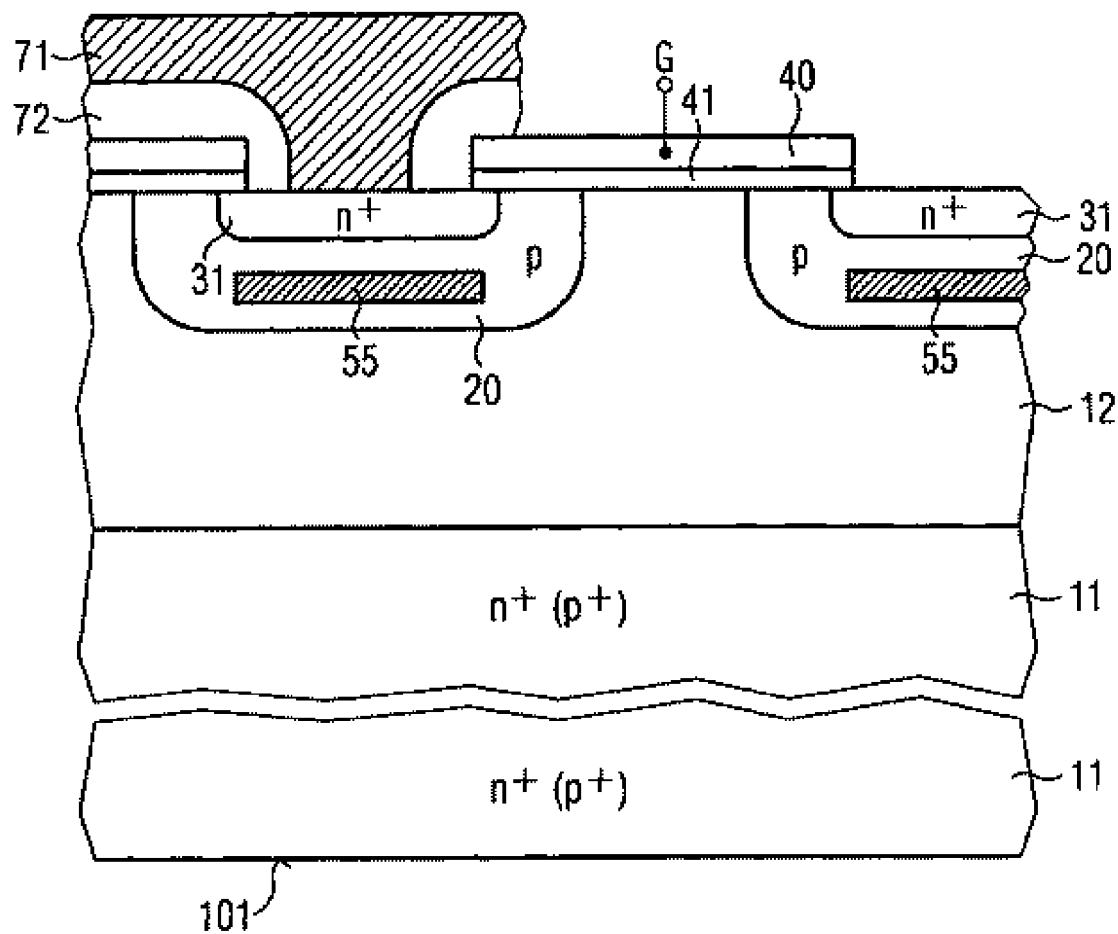

Such a buried recombination zone 55 may, of course, also be employed in the case of IGBTs, the first semiconductor layer 11 being p-doped in this case, which is likewise illustrated as an alternative in FIG. 8. In the case of an IGBT, said recombination zone serves to avoid the so-called "latching", that is to say an undesirable turn-on of the parasitic thyristor formed by the source zones 31, the body zones 20, the drift zone 12 and the drain zone 11. The position of the recombination zone 55 is chosen such that it is not included in space charge zones that occur during reverse-biased operation in the body zone 20.

It goes without saying that contact can also be made with the component in accordance with FIG. 8, in a manner that is not specifically illustrated, via its rear side by means of a low-impedance terminal electrode explained above.

Figure 1C:
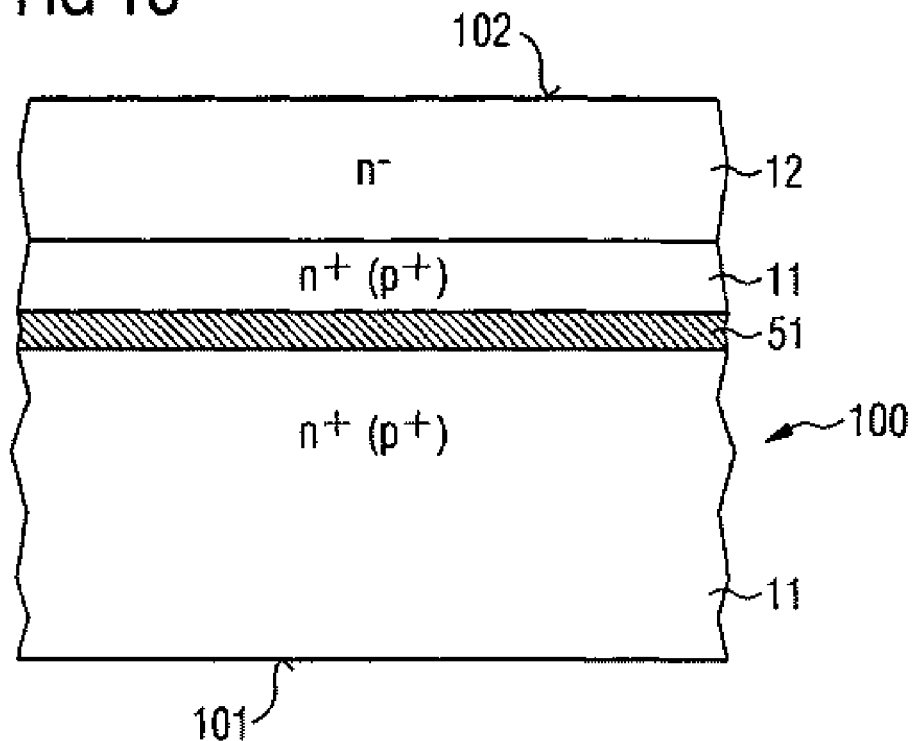
Figure 1D:
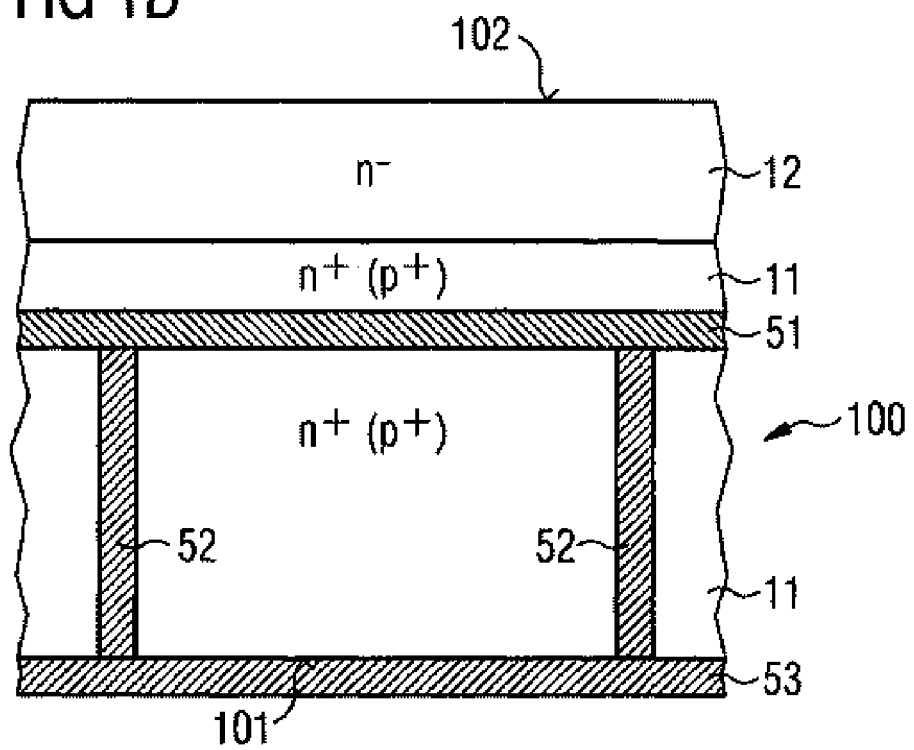

The method for fabricating a buried metallic layer in a semiconductor body as explained with reference to FIGS. 1a to 1c is also suitable for fabricating a recombination zone in a semiconductor component with the aim of suppressing shunt currents.

Figure 9:
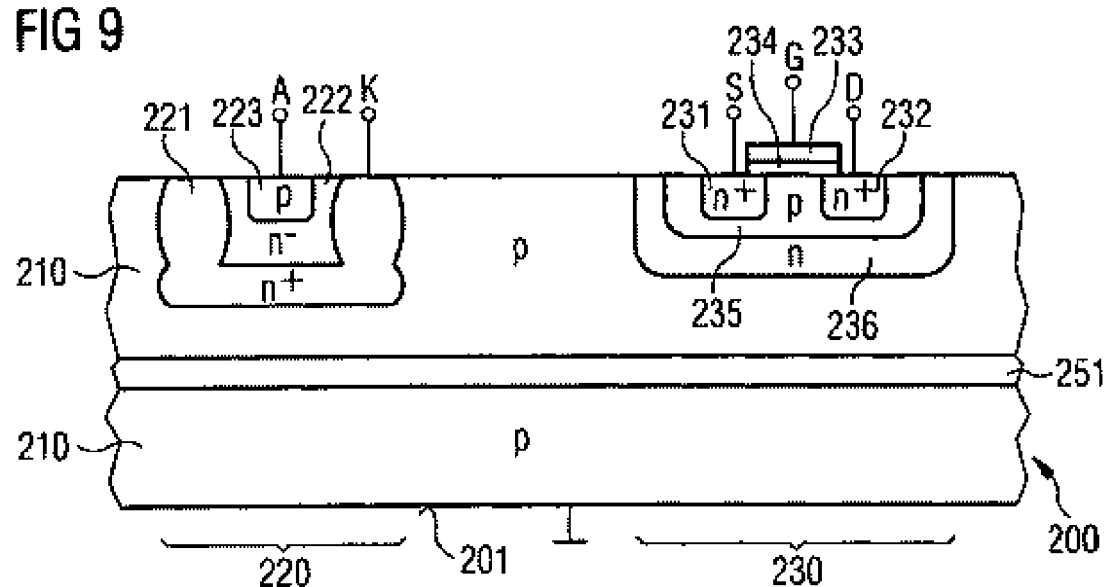
FIG. 9 shows, in side view in cross section, a semiconductor component comprising a plurality of component regions with a buried semiconductor layer for suppressing shunt currents.

FIG. 9 shows such a component, in which a buried metallic layer 251 is realized in a semiconductor body 200 by means of the thermomigration method explained above. Said metallic layer 251 is fabricated for example by applying a metal layer to a rear side 201 and subsequently producing a positive temperature gradient in the semiconductor body 200. The semiconductor body 200 has a p-type basic doping in the example, various component regions 220, 230 being realized by way of example in the region of the front side 201 in this semiconductor body. In the example, a power diode having a p-doped anode zone 223, an n-doped n-type base 222 and also a cathode zone 221 surrounding the n-type base 222 and the anode zone 223 is formed in a first component region 220. Provided that the semiconductor body 200 is in each case at the lowest potential that occurs in the circuit and the cathode terminal K of the diode has a higher potential, this component is insulated from further components realized in the semiconductor body 200 by means of the pn junction formed between the cathode zone 221 and the p-doped semiconductor zone 210 surrounding the cathode zone 221. If the potential of the cathode zone 221 falls below the potential of the surrounding semiconductor zone 210, then minority charge carriers can be injected into said semiconductor zone 210 and lead to shunt currents there.

In this case, the recombination zone 251 brings about an effective suppression of said shunt currents in the semiconductor zone 210 with respect to the further component region 230. In the example, an n-conducting MOSFET having a body zone 235, source and drain zones 231, 232, a gate electrode 233, a gate insulation layer 234 is formed in said component region 230, and is surrounded by an n-doped semiconductor zone 236. It goes without saying that the recombination zone fabricated according to the invention can be used in arbitrary circuits with a plurality of components for shunt current suppression.

The invention claimed is:

1. A method for fabricating a buried metallic layer at a predetermined vertical position in a semiconductor body having a first and second side, wherein the semiconductor body comprises a first and a second semiconductor layer arranged one above the other in the vertical direction of the semiconductor body, of which layers one forms the first side and the other forms the second side of the semiconductor body, wherein the first semiconductor layer is doped more heavily than the second semiconductor layer, which method comprises:

applying a metal layer to one of the first and second sides at least in sections, wherein the buried metallic layer is produced in the semiconductor layer adjoining the one side to which the metal layer is applied;

establishing a positive temperature gradient in a vertical direction of the semiconductor body proceeding from the one side, the temperature in the region of the one side being higher than the eutectic temperature of a system comprising the material of the metal layer and the semiconductor material of the semiconductor body so that the metal of the metal layer migrates in the vertical direction into the semiconductor body;

discontinuing the temperature gradient once the metal reaches the predetermined vertical position in the semiconductor body in order thereby to obtain the metallic layer at the predetermined position; and fabricating at least one metallic terminal connection extending in the vertical direction of the semiconductor body proceeding from one of the sides as far as the metallic layer.

2. The method of claim 1, wherein the metal of the metal layer is a material that p-dopes the semiconductor body.

3. The method of claim 2 wherein the material of the metal layer is aluminum.

4. The method of claim 1 wherein the metal of the metal layer is a material that n-dopes the semiconductor body.

5. The method of claim 4 wherein the material of the metal layer is tin with proportions of arsenic or tin with proportions of antimony.

6. The method of claim 1 wherein the fabrication of the at least one terminal connection comprises: fabricating at least one trench in the semiconductor body which extends proceeding from the one side as far as the metallic layer; and, filling the trench with an electrically conductive material in such a way that at least the surfaces of the trench are covered with the conductive material.

7. The method of claim 1 wherein the at least one terminal connection is fabricated at least in part on a lateral edge of the semiconductor body.

8. The method of claim 1 wherein a terminal contact layer is applied to the one of the sides, which terminal contact layer makes electrically conductive contact with the at least one terminal connection.

9. The method of claim 1 wherein a further metal layer is applied to the one side of the semiconductor body, and in which the semiconductor body is heated at least in the region of the one side to a temperature at which the metal of the further metal layer forms a metal-semiconductor alloy layer with the semiconductor material of the semiconductor body in the region of the one side.

10. The method of claim 9 wherein at least one semiconductor zone that is doped complementarily with respect to the second semiconductor layer is present in the second semiconductor layer, the buried metal layer being produced in such a way that it is embedded in said at least one complementarily doped semiconductor zone.

11. The method of claim 10 wherein the first semiconductor layer is doped complementarily with respect to the second semiconductor layer.

12. The method claim 1 wherein the temperature above the eutectic temperature and the positive temperature gradient are produced by particle irradiation of the semiconductor body proceeding from one of the sides.

13. The method of claim 12 wherein the particles are protons.

14. The method of claim 1 wherein the introduction of the metal into the semiconductor body is effected in two migration steps, in which case, in a first migration step, a first temperature gradient is established in order to produce a metal layer at a first vertical position in the semiconductor body, in a second migration step, a second temperature gradient is established in order to produce the metal layer at the predetermined vertical position in the semiconductor body.

15. The method of claim 14 wherein the second temperature gradient is established by means of particle irradiation.

16. The method of claim 15 wherein the metal used for the metal layer is aluminum.

17. A method for fabricating a buried metallic layer at a predetermined vertical position in a semiconductor body having a first and second side, which method comprises:
applying a metal layer to one of the first and second sides at least in sections;
establishing a positive temperature gradient in a vertical direction of the semiconductor body proceeding from the one side, the temperature in the region of the one side being higher than the eutectic temperature of a system comprising the material of the metal layer and the semiconductor material of the semiconductor body so that the metal of the metal layer migrates in the vertical direction into the semiconductor body, wherein the positive temperature gradient is produced by:
heating the semiconductor body to a first temperature which lies above the eutectic temperature, in the region of the one side to which the metal layer is applied; and,
heating the semiconductor body to a second temperature which is higher than the first temperature, in the region of the second side; and
discontinuing the temperature gradient once the metal reaches the predetermined vertical position in the semiconductor body in order thereby to obtain the metallic layer at the predetermined position.

18. The method of claim 17 wherein a temperature difference between the first and second sides for establishing the positive temperature gradient is between 2° C. and 100° C.

19. The method of claim 17 wherein the buried metallic layer is fabricated in a diode, a MOSFET or an IGBT.

20. A method for fabricating a low-impedance terminal electrode for a semiconductor component comprising:
providing a semiconductor body having a first and a second side, wherein the semiconductor body comprises a first and a second semiconductor layer arranged one above the other in the vertical direction of the semiconductor body, of which layers one forms the first side and the other forms the second side of the semiconductor body, wherein the first semiconductor layer is doped more heavily than the second semiconductor layer;
applying a metal layer to one of the sides, wherein a buried metallic layer is produced in the semiconductor layer adjoining the one side to which the metal layer is applied;
heating the semiconductor body at least in the region of the one side to a temperature at which the metal of the metal layer forms a metal-semiconductor alloy layer with the semiconductor material of the semiconductor body in the region of the one side; and
fabricating at least one metallic terminal connection extending in the vertical direction of the semiconductor body proceeding from one of the sides as far as the metallic layer.

21. The method of claim 20 wherein the metal of the metal layer is a material that p-dopes the semiconductor body.

22. The method of claim 21 wherein the material of the metal layer is aluminum.

23. The method of claim 20 wherein the metal of the metal layer is a material that n-dopes the semiconductor body.

24. The method of claim 23 wherein the material of the metal layer is tin with proportions of arsenic or tin with proportions of antimony.

25. The method of claim 20 wherein the temperature is more than 690° C.

* * * * *